United States Patent
Shiu et al.

(10) Patent No.: US 8,058,818 B2
(45) Date of Patent: Nov. 15, 2011

(54) LED DRIVING CIRCUIT AND A MOSFET SWITCH MODULE THEREOF

(75) Inventors: Shian-Sung Shiu, Yonghe (TW); Chung-Che Yu, Yonghe (TW); Juanjuan Liu, Wuxi (CN)

(73) Assignee: Green Solution Technology Co., Ltd., Taipei County (TW)

( * ) Notice: Subject to any disclaimer, the term of this patent is extended or adjusted under 35 U.S.C. 154(b) by 389 days.

(21) Appl. No.: 12/404,468

(22) Filed: Mar. 16, 2009

(65) Prior Publication Data

US 2009/0322252 A1 Dec. 31, 2009

(30) Foreign Application Priority Data

Jun. 30, 2008 (TW) ................ 97124585 A
Sep. 19, 2008 (TW) ................ 97136036 A

(51) Int. Cl.
*G05F 1/00* (2006.01)
*H05B 37/02* (2006.01)
*H05B 39/04* (2006.01)
*H05B 41/36* (2006.01)

(52) U.S. Cl. ......... 315/297; 315/291; 315/302; 315/307

(58) Field of Classification Search ................. None
See application file for complete search history.

(56) References Cited

U.S. PATENT DOCUMENTS

| | | | |
|---|---|---|---|
| 7,893,626 B2* | 2/2011 | Liu ......................... 315/185 R |
| 2008/0265793 A1* | 10/2008 | Gurr ........................... 315/225 |
| 2010/0072898 A1* | 3/2010 | Ohashi et al. ................. 315/127 |

* cited by examiner

*Primary Examiner* — Anh Tran
(74) *Attorney, Agent, or Firm* — Kile Goekjian Reed & McManus PLLC

(57) ABSTRACT

An LED driving circuit and a MOSFET switch module thereof is disclosed, and the MOSFET switch module which is used to control a current of the LED driving circuit. The present invention employs a voltage clamping device to clamp the voltage level of the drain of transistor in the MOSFET switch module when being turned off. Via this way, the requirement for the withstand voltage of the transistor is lowered, and so the cost and power consumption thereof is reduced.

11 Claims, 4 Drawing Sheets

US 8,058,818 B2

LED DRIVING CIRCUIT AND A MOSFET SWITCH MODULE THEREOF

CROSS-REFERENCE TO RELATED APPLICATION

This application claims priority under 35 U.S.C. §119 to Taiwan Patent Application No. 097124585, filed on Jun. 30, 2008, and Taiwan Patent Application No. 097136036, filed on Sep. 19, 2008, in the Taiwan Intellectual Property Office, the entire contents of which are hereby incorporated by reference.

BACKGROUND OF THE INVENTION

1. Field of the Invention

The present invention relates to a MOSFET switch module and an LED driving circuit that utilizes the MOSFET switch module; in particular, to a MOSFET switch module with voltage clamping function and an LED driving circuit that utilizes the MOSFET switch module.

2. Description of Related Art

Referring to FIG. 1, which shows a prior art LED driving device. The LED driving device comprises a dimmer control unit 10, an error amplifier 15, an n-channel metal-oxide-semiconductor field-effect transistor (NMOS) 20, a power supply 25, an LED module 30, and a current detecting resistor R. The power supply 25 couples to one end of the LED module 30 so as to provide a driving voltage for driving the LED module 30 to emit light. The NMOS 20 is couple to the other end of the LED module 30, and controls the amount of current flowing through the LED module 30 according to a switch control signal. The current detecting resistor R is coupled to the NMOS 20, so as to detect the amount of current flowing through the LED module 30, and generate a current detection signal. The error amplifier 15 receives the current detection signal from the resistor R and a control signal from the dimmer control unit 10, and according to these two signals outputs the switch control signal to the NMOS 20, so as to control the amount of current flowing through the NMOS 20. The dimmer control unit 10 may receive a dimmer signal, and when the dimmer signal indicates ON status, generates a reference signal as the control signal. The error amplifier 15 makes a voltage level of the current detection signal from the resistor R equal to that of the reference signal of the dimmer control unit 10, and the NMOS 20 is thereby under ON status. On the other hand, when the dimmer signal indicates OFF status, the dimmer control unit 10 generates a low level signal as the control signal, so that the NMOS 20 is under OFF status. According to the dimmer process mentioned above, the dimming effect is thereby achieved.

When NMOS 20 has been cut off (OFF status), current no longer flows through the LED module 30, and at this time, the voltage of the drain of the NMOS 20 has been pulled to the level roughly equal to the driving voltage. By using 4 volt driving voltage of single LED as an example, when the LED module 30 has 20 LEDs connected in series, the overall driving voltage is 80 volt. Therefore, the NMOS 20 must be MOSFET with high withstand voltage characteristic. Due to this high withstand voltage requirement, the die size of the MOSFET needs to be larger and so the cost is greater, and additionally the gate-source capacitance (Cgs) also be increased. The increase of the gate-source capacitance (Cgs) means that the error amplifier 15 must also require high driving capability so as to drive NMOS 20. Furthermore, the power consumption of the MOSFET is in direct proportion to $fCV^2$, wherein f is the switching frequency, C is the capacitance value of the gate-source (i.e. Cgs), and V is the voltage change from switching. Therefore the higher requirement of withstand voltage for a MOSFET, the higher power consumption, and also a heat dissipation circuit may have to be added so as to prevent the MOSFET from overheating and damaged.

SUMMARY OF THE INVENTION

In view of the aforementioned issues in prior art, the present invention utilizes a voltage clamping unit, so that when the MOSFET for controlling the current of the LED module has been cutoff, the voltage level of the drain of the MOSFET may be clamped, so that the withstand voltage requirement for the MOSFET may be lowered. Thereby, not only may the cost for LED driving circuit be reduced, the power consumption of the MOSFET therein may also be reduced, so that the overall efficiency of the circuit is increased.

To achieve the aforementioned objects, the present invention provides a MOSFET switch module, which includes a transistor switch, a dimmer control unit, and a voltage clamping unit. The transistor switch has a control terminal, a first terminal, and a second terminal. The first terminal of the transistor switch is coupled to an LED module. The dimmer control unit is couple to the control terminal of the transistor switch and the dimmer control unit includes a multiplexer, the multiplexer receives a first reference signal, a second reference signal, and a dimmer signal, and according to the dimmer signal selects either the first reference signal or the second reference signal for output, so as to control the amount of current flowing through the transistor switch. The voltage clamping unit is coupled to the first terminal of the transistor switch, so that the voltage difference between the first terminal and the second terminal is less than a preset voltage value.

The present invention also provides an LED driving circuit, which includes a current control device, a dimmer control unit, and a voltage clamping unit. The current control device includes a control terminal, a plurality of first terminal, and a second terminal, in which the plurality of first terminals is coupled correspondingly to a plurality of LED units of an LED module, wherein the amount of current flowing through each of the plurality of first terminal is generally the same. The dimmer control unit is coupled to the control terminal of the current control device, wherein the dimmer control unit includes a multiplexer, and the multiplexer receives a first reference signal, a second reference signal, and a dimmer signal, and according to the dimmer signal selects either the first reference signal or the second reference signal for output, so as to control the amount of current flowing through the current control device. The voltage clamping unit is coupled to the plurality of first terminals of the current control device, so that the voltage difference between each of the plurality of first terminal and the second terminal is less than a preset voltage value.

The aforementioned summary and following detailed descriptions are simply exemplary in order to facilitate further understanding of the scope of the present invention. Other objectives and advantages of the present invention will be set forth at length in the descriptions and appended drawings illustrated hereunder.

DETAILED DESCRIPTION OF PREFERRED EMBODIMENTS

Figure 1:
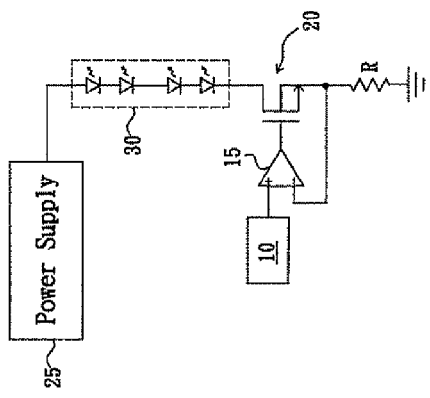
FIG. 1 is a prior art Light Emitting Diode (LED) driving device.
Figure 2:
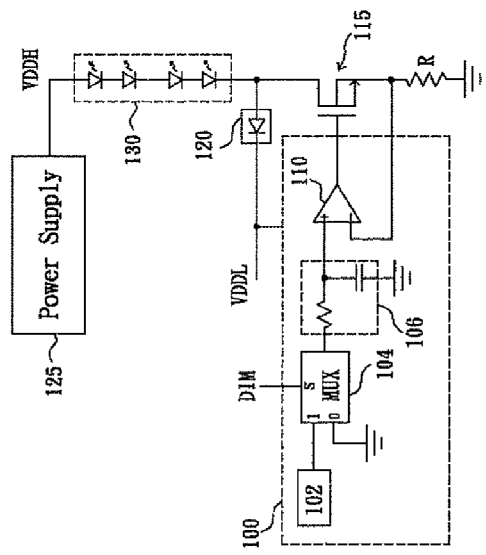
FIG. 2 shows a preferred embodiment of a circuit diagram for a metal-oxide-semiconductor field-effect transistor (MOSFET) module that is utilizes within an LED driving circuit according to the present invention.

Refer now to FIG. 2, which shows a preferred embodiment of a circuit diagram for a MOSFET switch module that is utilizes within an LED driving circuit according to the present invention. The LED driving circuit includes a dimmer control unit 100, a transistor switch 115, a voltage clamping unit 120, a voltage supply 125, and an LED module 130. The power supply 125 is coupled to one end of the LED module 130 so as to provide a driving voltage VDDH for driving the LED module 130 to emit light. The transistor switch 115 includes a control terminal, a first terminal and a second terminal, the first terminal is coupled to the other end of the LED module 130, the second terminal is coupled to a reference voltage (e.g. ground), and the control terminal receives a control signal generated by the dimmer control unit 100. The dimmer control unit 100 includes a reference voltage generator 102, a multiplexer 104, a filter circuit 106, and an error amplifier 110. One input end of the multiplexer 104 receives a first reference signal generated by the reference voltage generator 102, another input end of the multiplexer 104 receives a second reference signal (which in the present embodiment is the ground), and the multiplexer 104 according to a dimmer signal DIM selects either the first reference signal or the second reference signal for output. The filter circuit 106 is coupled between the multiplexer 104 and the error amplifier 110, so as to filter the noise due to the switching between the first reference signal or the second reference signal. The inverting input of the error amplifier 110 receives a detection signal (which is the same voltage level as the second terminal of the transistor switch 115) generated by a current detecting resistor R, the non-inverting input of the error amplifier 110 receives the reference signal outputted by the multiplexer 104, so as to adjust a level of an output signal outputted by the error amplifier 110 according to the level of the reference signal, so that the level of the detection signal is constrained to be around the level of the reference signal outputted by the multiplexer 104.

When the dimmer signal DIM indicates ON status (e.g. a signal with high level), the multiplexer 104 selects and outputs the first reference signal generated by the reference voltage generator 102, and at this time the transistor switch 115 is turned on and a preset amount of current may flow there through, so that the detection signal generated by the current detecting resistor R and the first reference signal have the same signal level. Therefore, the LED module 130 may continuously emit light in a stable way. On the other hand when the dimmer signal DIM indicates OFF status (e.g. a signal with low level), the multiplexer 104 selects the second reference signal (which is of zero voltage level) for output, and at this time the transistor switch 115 is cutoff and the amount of current flowing through the transistor switch 115 is decreased to be close to zero, so that the LED module 130 does not emit light. The voltage clamping unit 120 is coupled to the first terminal of the transistor switch 115 and to a reference voltage, and when the dimmer signal indicates OFF status, the voltage clamping unit 120 restricts the voltage level of the first terminal to a preset voltage value, thereby ensure the voltage difference between the first terminal and the second terminal is less than a preset voltage value. The reference voltage may be a ground voltage or a steady voltage supplied by a power supply of a system, in the present embodiment, the reference voltage is a supply voltage VDDL of the dimmer control unit, and the voltage clamping unit 120 is a diode.

The preset voltage value used by the voltage clamping unit 120 for restriction is set according to the light emitting threshold voltage of the LED module 130, the preferred setting may be arrived from having a driving voltage VDDH minus the light emitting threshold voltage. For example, the driving voltage VDDH is 80 volt, and the LED module 130 includes 20 LEDs serially connected, which on average has an light emitting threshold voltage of 3.5V, so that the light emitting threshold voltage for the LED module 130 is 20*3.5=70 volt; therefore, the preset voltage value may be set at about 80−70=10 volt, and preferably a preset voltage value is just slightly above 10 volt, so as to ensure that the LED module 130 does not emit light. So, when the dimmer signal DIM indicates ON status, the voltage level of the first terminal of the transistor switch 115 is less than the preset voltage value of 10 volt. At this time, the LED module 130 emits light, and the voltage clamping unit 120 does not come into effect. On the other hand when the dimmer signal DIM indicates OFF status, the transistor switch 115 is cutoff so that the LED module stops emitting light, and at this time the voltage of the first terminal is restricted by the voltage clamping unit 120 to be around 10 volt. So, the withstand voltage of the transistor switch 115 only needs to be slightly higher than 10 volt, not need to be 80 volt in conventional device without the voltage clamping function of the present invention.

Therefore, the LED driving circuit of the present invention only needs to use a general low voltage MOSFET and does not require a high voltage MOSFET, so that the cost of the circuit may be decreased. Also, a low voltage MOSFET not only has a lower requirement in regard to the driving ability of the dimmer control unit, but the power consumption thereof is also lower, so that the efficiency of the LED driving circuit is increased.

Figure 3:
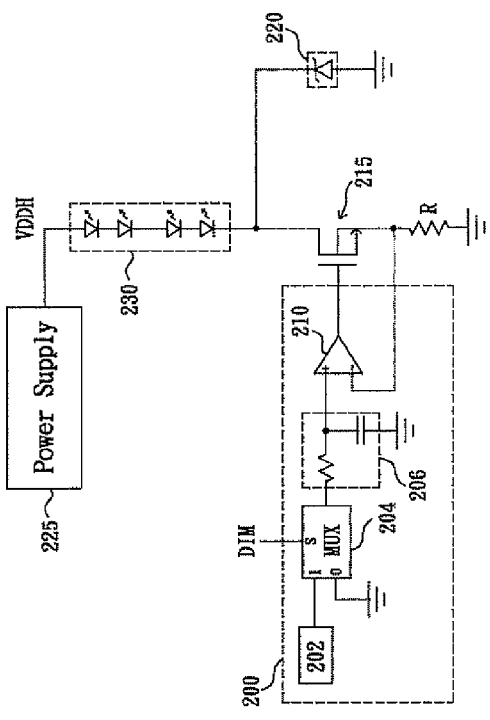
FIG. 3 shows another preferred embodiment of a circuit diagram for a MOSFET switch module that is utilizes within an LED driving circuit according to the present invention.

Besides the diode shown in FIG. 2, the voltage clamping unit 120 may be other components with voltage clamping function. Please refer to FIG. 3, which shows another preferred embodiment of a circuit diagram for a MOSFET switch module that is utilizes within an LED driving circuit according to the present invention. The LED driving circuit of the present embodiment includes a dimmer control unit 200, a transistor switch 215, a voltage clamping unit 220, a power supply 225, and an LED module 230. The dimmer control unit 200 includes a reference voltage generator 202, a multiplexer 204, a filter circuit 206, and an error amplifier 210. As compared to the circuit shown by FIG. 2, the voltage clamping unit 220 of FIG. 3 is a zener diode, coupled between the first terminal of the transistor switch 215 and a reference voltage (e.g. ground), so that according to a dimmer signal DIM received by the multiplexer 204 of the dimmer control unit 200, the voltage of the first terminal of the transistor switch 215 may be restricted at or below a preset voltage value. The other capabilities and functions for the components shown in of FIG. 3 is the same as those of FIG. 2, so the same explanation is here by omitted.

Figure 4:
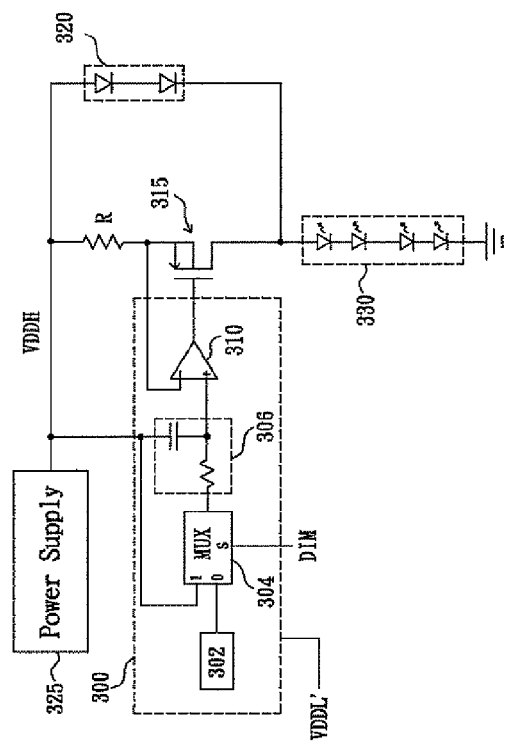
FIG. 4 shows yet another preferred embodiment of a circuit diagram for a MOSFET switch module that is utilizes within an LED driving circuit according to the present invention.
Figure 5:
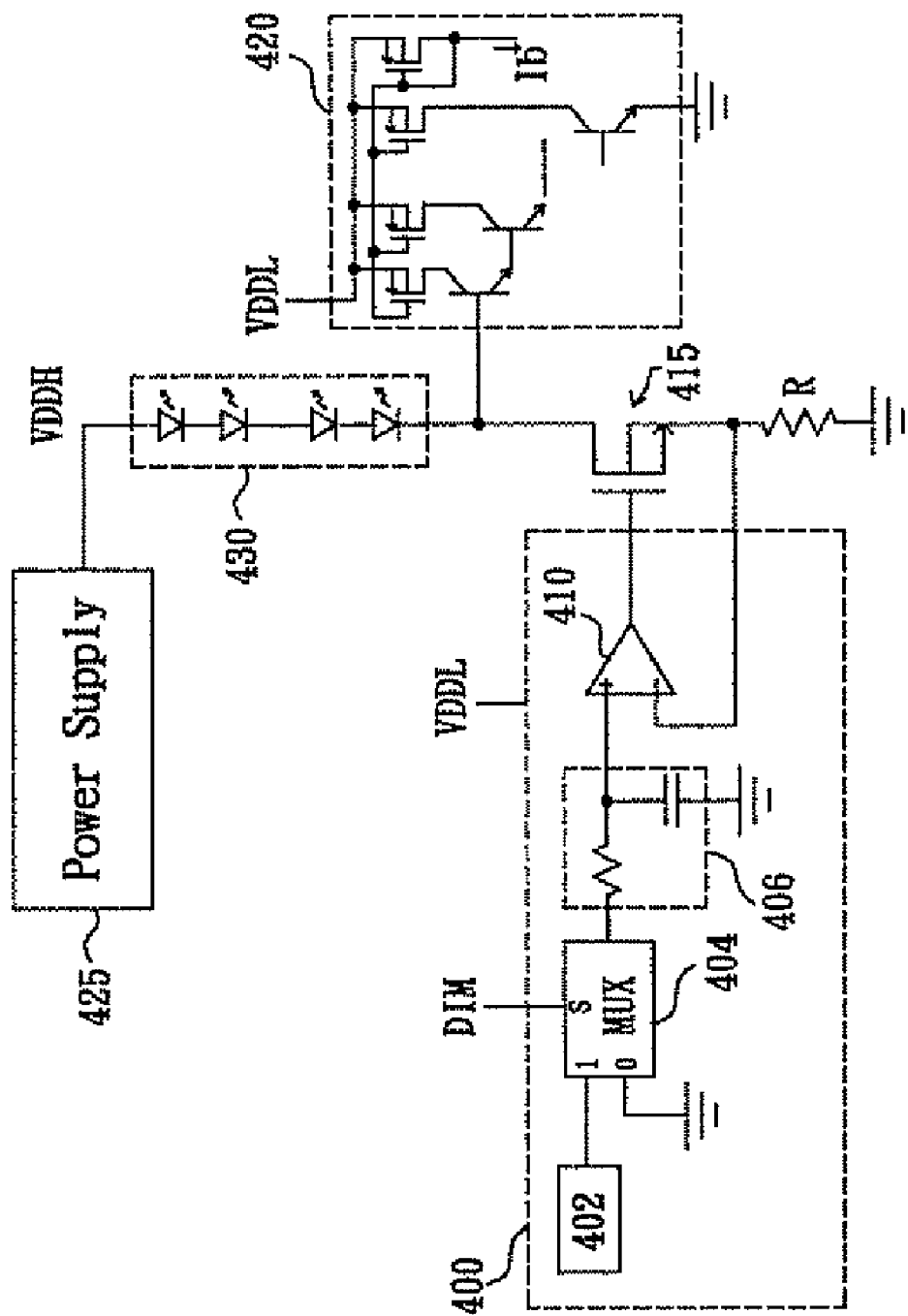
FIG. 5 shows yet a further preferred embodiment of a circuit diagram for a MOSFET switch module that is utilizes within an LED driving circuit according to the present invention.

The aforementioned two embodiments both uses an N-channel MOSFET as example, but in practical applications, a P-channel MOSFET, a plurality of N-channel MOSFET, or a plurality of P-channel MOSFET (e.g. for the high current operation) may be used as the transistor switch. Please refer to FIG. 4, which shows yet another preferred embodiment of a circuit diagram for a MOSFET switch module that is utilizes within an LED driving circuit according to the present invention. The LED driving circuit of the present embodiment includes a dimmer control unit 300, a transistor switch 315, a voltage clamping unit 320, a power supply 325, and an LED module 330. The dimmer control unit 300 includes a reference generator 302, a multiplexer 304, a filter circuit 306, and an error amplifier 310. In the present embodiment, the dimmer control unit 300 is coupled to a reference voltage (the driving voltage VDDH outputted by the power supply 325) and a supply voltage VDDL'. The transistor switch 315 is a P-channel MOSFET. The first terminal of the transistor switch 315 is coupled to the LED module 330, the second terminal of the transistor switch 315 is coupled to a reference voltage (which in the present embodiment, the reference voltage is the driving voltage VDDH outputted by the power supply 325). One end of the LED module 330 is coupled to the first terminal of the transistor switch 315; the other end of the LED module 330 is couple to the ground. The dimmer control unit 300 controls the status (i.e. on or cutoff) of the transistor switch 315 according to a dimmer signal DIM so as to achieve light adjustment function. The voltage clamping unit 320 includes at least a diode, and the number of the diode may be used to adjust the preset voltage value of the voltage clamping unit 320 (such as, the clamping preset voltage value=N*Vd, wherein N is the number of diodes, and Vd is the forward bias voltage of the PN junction of the diode), so that even when the transistor switch 315 is under the cutoff status, the voltage difference at the two terminals of the transistor switch 315 (i.e. first terminal and second terminal) is less than the preset voltage value Next, please refer to FIG. 5, which shows yet a further preferred embodiment of a circuit diagram for a MOSFET switch module that is utilizes within an LED driving circuit according to the present invention. The LED driving circuit of the present embodiment includes a dimmer control unit 400, a transistor switch 415, a voltage clamping unit 420, a power supply 425, and an LED module 430. The dimmer control unit 400 includes a reference voltage generator 402, a multiplexer 404, a filter circuit 406, and an error amplifier 410. As compared to the embodiment of FIG. 2, voltage clamping unit 420 of FIG. 5 includes at least a bipolar transistor, the emitter of one bipolar transistor couples to the base of the next bipolar transistor, and the emitter of the last bipolar transistor couples to the ground, and the collector of these bipolar transistors couples to a power source, so that the bipolar transistors may achieve the PN junction characteristic so as to restrict the voltage difference between the first terminal and the second terminal of the transistor switch 415 to less than a preset voltage value.

Figure 6:
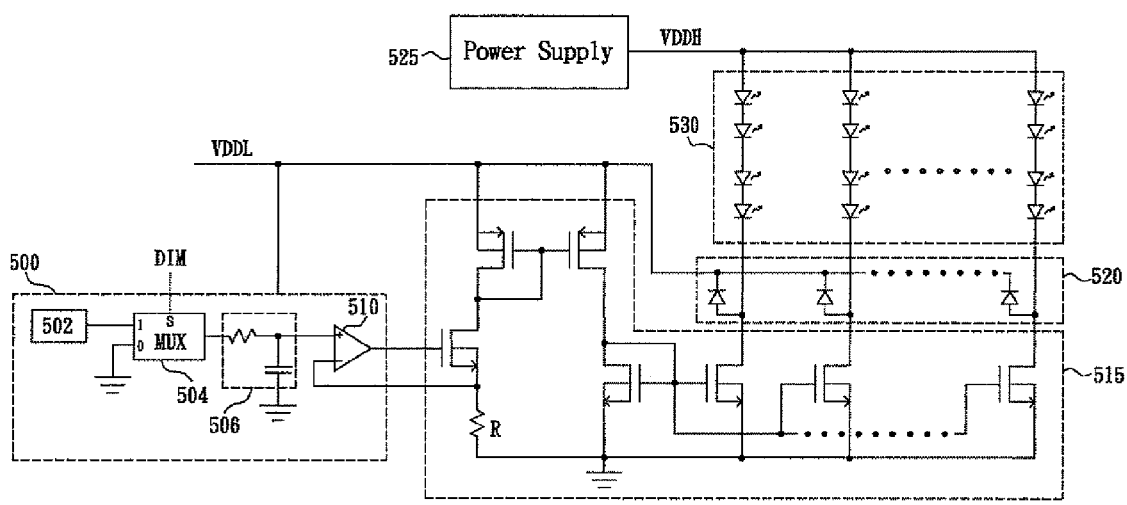
FIG. 6 shows a circuit diagram for an LED module with a plurality of LED units connected in parallel that is applied to an LED driving circuit according to the present invention.

The aforementioned embodiments all use LED module with a single string of serially connected LED units as example, but in practical applications the MOSFET switch module of the present invention may also be applied to LED module formed by multiple strings of LED units connected in parallel. Please refer to FIG. 6, which shows a circuit diagram for an LED module with a plurality LED units connected in parallel that is applied to an LED driving circuit according to the present invention. The LED driving circuit of the present embodiment includes a dimmer control unit 500, a current control device 515, a voltage clamping unit 520, a power supply 525, and an LED module 530. Dimmer control unit 500 includes a reference voltage generator 502, a multiplexer 504, a filter circuit 506, and an error amplifier 510. The LED module 530 is formed by multiple strings of LED units connected in parallel. The current control device 515 includes a control terminal, a plurality of first terminals, and a second terminal, in which the plurality of first terminals is coupled correspondingly to the plurality of LED units of the LED module 530, and the second terminal of the current control device 515 couples to the ground. The current control device 515 is a current mirror circuit, so that the amount of current flowing through the plurality of first terminals is practically the same, and the brightness of the plurality of LED units of the LED module 530 is essentially the same. The voltage clamping unit 520 includes a plurality of diodes; the positive ends of the plurality of diodes are respectively coupled to the plurality of first terminals of the current control device 515, and the negative ends of the plurality of diodes are coupled to a reference voltage, wherein the reference voltage is supply voltage VDDL in the present invention. Thereby, the voltage difference between each of the plurality of first terminal and the second terminal is less than a preset voltage value.

As per the descriptions above, the voltage clamping unit of the present invention may be any component with voltage clamping function and a combination thereof for example the voltage clamping unit may be at least a diode, at least a zener diode, at least a bipolar transistor, or a combination thereof. Furthermore, every controller, for example the dimmer control unit of the embodiments, includes an electrostatic discharge (ESD) unit, so that the voltage level applied to the circuits of the controller is clamped to generally between the voltage of the ground and the operational voltage, so as to prevent damage to the controller from sudden spike of high voltage due to electrostatic. Therefore, the electrostatic discharge unit of the controller may also be a voltage clamping unit of the present invention since it achieves equivalent function.

As described above, the present invention has satisfied the three patent requirements of novelty, inventiveness, and commercial application. The present invention has been disclosed through the preferred embodiments thereof as set forth hereinbefore, but those skilled in the art can appreciate that such embodiments simply provide illustrations of the present invention, rather than being interpreted as limiting the scope thereof. It is noted that all effectively equivalent changes, modifications, and substitutions made to those disclosed embodiments are deemed to be encompassed within the scope of the present invention. Therefore, the scope of the present invention to be legally protected should be delineated by the following claims.

What is claimed is:

1. A MOSFET switch module, comprising:
a transistor switch, which has a control terminal, a first terminal, and a second terminal, in which the first terminal is coupled to an LED module;
a dimmer control unit, coupled to the control terminal of the transistor switch, the dimmer control unit includes a multiplexer, an error amplifier, and a filter circuit, wherein the multiplexer receives a first reference signal, a second reference signal, and a dimmer signal, and according to the dimmer signal selects either the first reference signal or the second reference signal for output, so as to control the amount of current flowing through the transistor switch, the error amplifier controls the transistor switch according to the voltage level of the second terminal and the reference signal outputted by the multiplexer, and filter circuit is coupled between the multiplexer and the error amplifier, so as to filter the noise of the reference signal outputted by the multiplexer; and a voltage clamping unit, coupled to the first terminal of the transistor switch, so that the voltage difference between the first terminal and the second terminal is less than a preset voltage value.

2. The MOSFET switch module according to claim 1, wherein the voltage clamping unit is an electrostatic discharge (ESD) unit for the dimmer control unit.

3. The MOSFET switch module according to claim 1, wherein the voltage clamping unit comprises at least a diode, a zener diode, a bipolar transistor, or a combination thereof.

4. The MOSFET switch module according to claim 1, wherein when the multiplexer selects the second reference signal for output, the amount of current flowing through the transistor switch is decreased to be close to zero.

5. An LED driving circuit, comprising:
  a current control device, which has a control terminal, a plurality of first terminals, and a second terminal, in which the plurality of first terminals is coupled correspondingly to a plurality of LED units of an LED module, wherein the amount of current flowing through each of the plurality of first terminal is generally the same;
  a dimmer control unit, coupled to the control terminal of the current control device, the dimmer control unit includes a multiplexer, the multiplexer receives a first reference signal, a second reference signal, and a dimmer signal, and according to the dimmer signal selects either the first reference signal or the second reference signal for output, so as to control the amount of current flowing through the current control device; and
  a voltage clamping unit, coupled to the plurality of first terminals of the current control device, so that the voltage difference between each of the plurality of first terminal and the second terminal is less than a preset voltage value.

6. The LED driving circuit according to claim 5, wherein the current control device is a current mirror circuit.

7. The LED driving circuit according to claim 5, wherein the voltage clamping unit is an electrostatic protection unit for the dimmer control unit.

8. The LED driving circuit according to claim 5, wherein the voltage clamping unit comprises at least a diode, a zener diode, a bipolar transistor, or a combination thereof.

9. The LED driving circuit according to claim 5, wherein when the multiplexer selects the second reference signal for output, the amount of current flowing through the current control device is decreased to be close to zero.

10. The LED driving circuit according to claim 5, wherein the dimmer control unit further comprises an error amplifier, and the error amplifier controls the transistor switch according to the voltage level of the second terminal and the reference signal outputted by the multiplexer.

11. The LED driving circuit according to claim 10, wherein the dimmer control unit further comprises a filter circuit coupled between the multiplexer and the error amplifier, so as to filter the noise of the reference signal outputted by the multiplexer.

* * * * *